US009427954B2

(12) United States Patent
Yazaki et al.

(10) Patent No.: US 9,427,954 B2
(45) Date of Patent: Aug. 30, 2016

(54) PIEZOELECTRIC ELEMENT, LIQUID EJECTING HEAD, AND LIQUID EJECTING APPARATUS

(71) Applicant: SEIKO EPSON CORPORATION, Tokyo (JP)

(72) Inventors: Shiro Yazaki, Chino (JP); Shunsuke Watanabe, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/868,464

(22) Filed: Sep. 29, 2015

(65) Prior Publication Data

US 2016/0089877 A1    Mar. 31, 2016

(30) Foreign Application Priority Data

Sep. 29, 2014   (JP) .................... 2014-198201

(51) Int. Cl.
| | |
|---|---|
| *B41J 2/14* | (2006.01) |
| *B41J 2/045* | (2006.01) |
| *H01L 41/047* | (2006.01) |
| *H01L 41/09* | (2006.01) |

(52) U.S. Cl.
CPC .............. *B41J 2/045* (2013.01); *B41J 2/14233* (2013.01); *H01L 41/0472* (2013.01); *H01L 41/0475* (2013.01); *H01L 41/0973* (2013.01); *B41J 2002/14241* (2013.01); *B41J 2002/14491* (2013.01)

(58) Field of Classification Search
CPC .............. B41J 2/14201; B41J 2/14233; B41J 2/14274; B41J 2002/14266; H01L 41/047; H01L 41/0475; H01L 41/0477; H01L 41/0478; H01L 41/0831; H01L 41/0833
See application file for complete search history.

(56) References Cited

U.S. PATENT DOCUMENTS

| | | | |
|---|---|---|---|
| 2011/0050808 A1* | 3/2011 | Cruz-Uribe | .......... B41J 2/14201 347/68 |
| 2013/0135400 A1 | 5/2013 | Yazaki et al. | |
| 2013/0200753 A1 | 8/2013 | Dausch et al. | |

FOREIGN PATENT DOCUMENTS

| | | |
|---|---|---|
| JP | 62082042 | 4/1987 |
| JP | 2013-111807 | 6/2013 |
| WO | 2013/002774 | 1/2013 |

OTHER PUBLICATIONS

European Search Report for Application No. 15187153.0 dated Feb. 29, 2016.

* cited by examiner

*Primary Examiner* — Geoffrey Mruk
(74) *Attorney, Agent, or Firm* — Workman Nydegger

(57) ABSTRACT

A piezoelectric element includes a first electrode layer which is stacked on the vibrating plate; a second electrode layer which is stacked on a side opposite to the vibrating plate with respect to the first electrode layer; a piezoelectric layer which is interposed between the first electrode layer and the second electrode layer; and a conductive layer which electrically connects the first electrode layer to external wiring, in which a point of contact between the conductive layer and the first electrode layer is in a vibrating region of the vibrating plate.

7 Claims, 10 Drawing Sheets

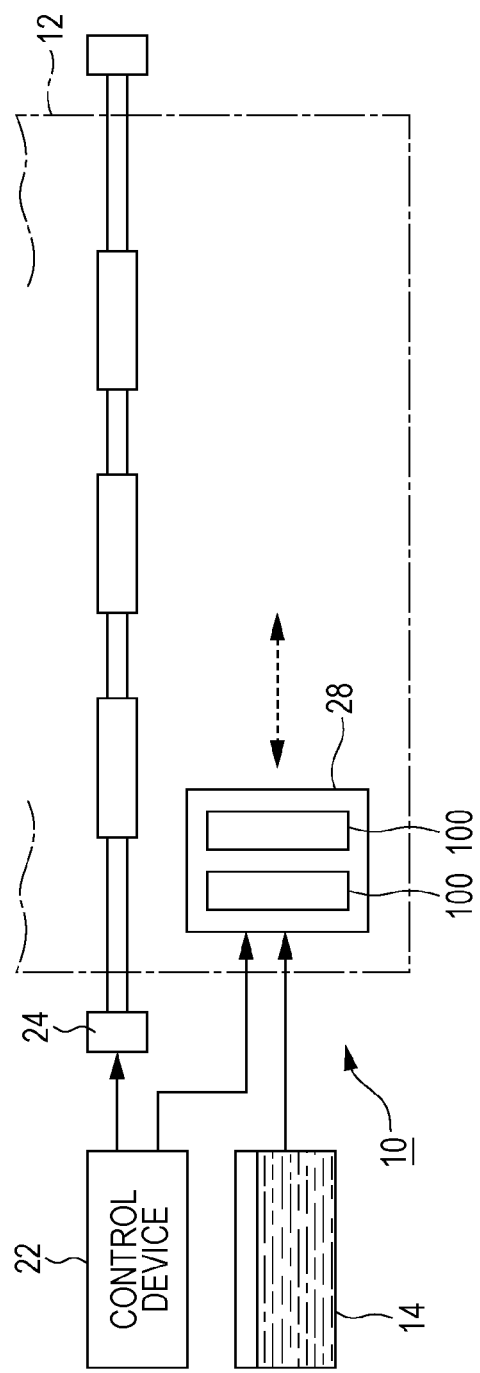

PIEZOELECTRIC ELEMENT, LIQUID EJECTING HEAD, AND LIQUID EJECTING APPARATUS

CROSS-REFERENCE TO RELATED APPLICATIONS

The present application claims priority to Japanese Patent Application No. 2014-198201 filed on Sep. 29, 2014, which is hereby incorporated by reference in its entirety.

BACKGROUND

1. Technical Field

The present invention relates to a piezoelectric element in which a piezoelectric layer is formed between electrode layers which face each other.

2. Related Art

A piezoelectric element is used in a wide range of fields such as a liquid ejecting apparatus which ejects liquid (for example, ink), or a vibration detecting device which detects vibration. For example, in JP-A-2013-111807, a configuration in which a piezoelectric element with a structure in which a piezoelectric layer is interposed between a lower electrode and a higher electrode which are stacked in a vibrating plate is adopted in a liquid ejecting apparatus is disclosed.

SUMMARY

A lower electrode of a piezoelectric element is formed so as to extend to the outside from a region in which the lower electrode overlaps with a higher electrode in a planar view, and an end portion thereof is electrically connected to external wiring. That is, the lower electrode is formed so as to intersect an end portion (periphery) of the higher electrode in a planar view. Since a piezoelectric layer is displaced due to an operation of an electric field which occurs between the higher electrode and the lower electrode even in the vicinity of a region in which the end portion of the higher electrode intersects the lower electrode, there is a possibility that the higher electrode on a plane of the piezoelectric layer may be separated from the end portion. An advantage of some aspects of the invention is to suppress a separation of an electrode layer of a piezoelectric element.

According to a preferred aspect of the invention, there is provided a piezoelectric element including: a first electrode layer which is staked on a vibrating plate; a second electrode layer which is stacked on a side opposite to the vibrating plate with respect to the first electrode layer; a piezoelectric layer which is interposed between the first electrode layer and the second electrode layer; and a conductive layer which electrically connects the first electrode layer to external wiring, in which a point of contact between the conductive layer and the first electrode layer is in a vibrating region of the vibrating plate. In the aspect, since the first electrode layer which interposes the piezoelectric layer between the first electrode layer and the second electrode layer is connected to the external wiring through the conductive layer, it is not necessary to provide a configuration in which an end portion of the second electrode layer overlaps with the first electrode layer in a planar view. Accordingly, it is possible to suppress a separation of the second electrode layer (end portion, in particular) which is caused by a displacement of the piezoelectric layer. The vibrating region is a region which vibrates in conjunction with a displacement of the piezoelectric layer in the vibrating plate.

The piezoelectric element according to the preferred aspect of the invention includes an insulating layer between the conductive layer and the second electrode layer, and the piezoelectric layer does not include an active unit between the conductive layer and the second electrode layer. In the aspect, since the insulating layer is interposed between the second electrode layer and the conductive layer, an active unit is not formed in the piezoelectric layer between the conductive layer and the second electrode layer. Accordingly, the above described effect in which it is possible to suppress a separation of the second electrode layer which is caused by the displacement of the piezoelectric layer becomes particularly remarkable. Specifically, the insulating layer is located between the conductive layer and the first electrode layer, and the conductive layer and the first electrode layer are electrically connected through a conductive hole which is formed in the vibrating region in the insulating layer.

In the piezoelectric element according to the preferred aspect of the invention, the first electrode layer is an individual electrode, and the second electrode layer is a common electrode. In the aspect, the active unit of the piezoelectric layer is defined in the first electrode layer which is close to a neutral plane of vibration of the vibrating plate. Accordingly, there is an advantage that a concentration of stress in the second electrode layer is suppressed compared to a configuration in which the first electrode layer is set to a common electrode, and the second electrode layer is set to an individual electrode (configuration in which active unit is defined in the second electrode layer).

In the piezoelectric element according to the preferred aspect of the invention, the point of contact is located at approximately a center of the vibrating region. In the aspect, since a point of contact between the first electrode layer and the conductive layer is located at approximately the center of the vibrating region, there is an advantage that a bias of the vibrating plate in the vibrating region is suppressed.

According to another preferred aspect of the invention, there is provided a liquid ejecting head including: a pressure chamber substrate in which an opening portion which will be a pressure chamber filled with liquid is formed; a vibrating plate which seals the opening portion by being stacked on the pressure chamber substrate; and a piezoelectric element which vibrates the vibrating plate. The piezoelectric element includes a first electrode layer which is stacked on the vibrating plate, a second electrode layer which is stacked on a side opposite to the vibrating plate with respect to the first electrode layer, a piezoelectric layer which is interposed between the first electrode layer and the second electrode layer, and a conductive layer which electrically connects the first electrode layer to external wiring, and wherein a point of contact between the conductive layer and the first electrode layer is in a vibrating region of the vibrating plate. In the aspect, since the first electrode layer which interposes the piezoelectric layer between the first electrode layer and the second electrode layer is connected to external wiring through the conductive layer, a configuration in which the end portion of the second electrode layer overlaps with the first electrode layer in a planar view is not necessary. Accordingly, it is possible to suppress a separation of the second electrode layer which is caused by the displacement of the piezoelectric layer.

According to still another preferred aspect of the invention, there is provided a liquid ejecting apparatus including the liquid ejecting head according to the preferred aspect of the invention. A preferable example of the liquid ejecting head is a printing apparatus which ejects ink; however, a use of the liquid ejecting apparatus according to the aspect of the invention is not limited to printing.

BRIEF DESCRIPTION OF THE DRAWINGS

The invention will be described with reference to the accompanying drawings, wherein like numbers reference like elements.

FIG. 13 is a configuration diagram of a printing apparatus according to a modification example.

DESCRIPTION OF EXEMPLARY EMBODIMENTS

First Embodiment

Figure 1:
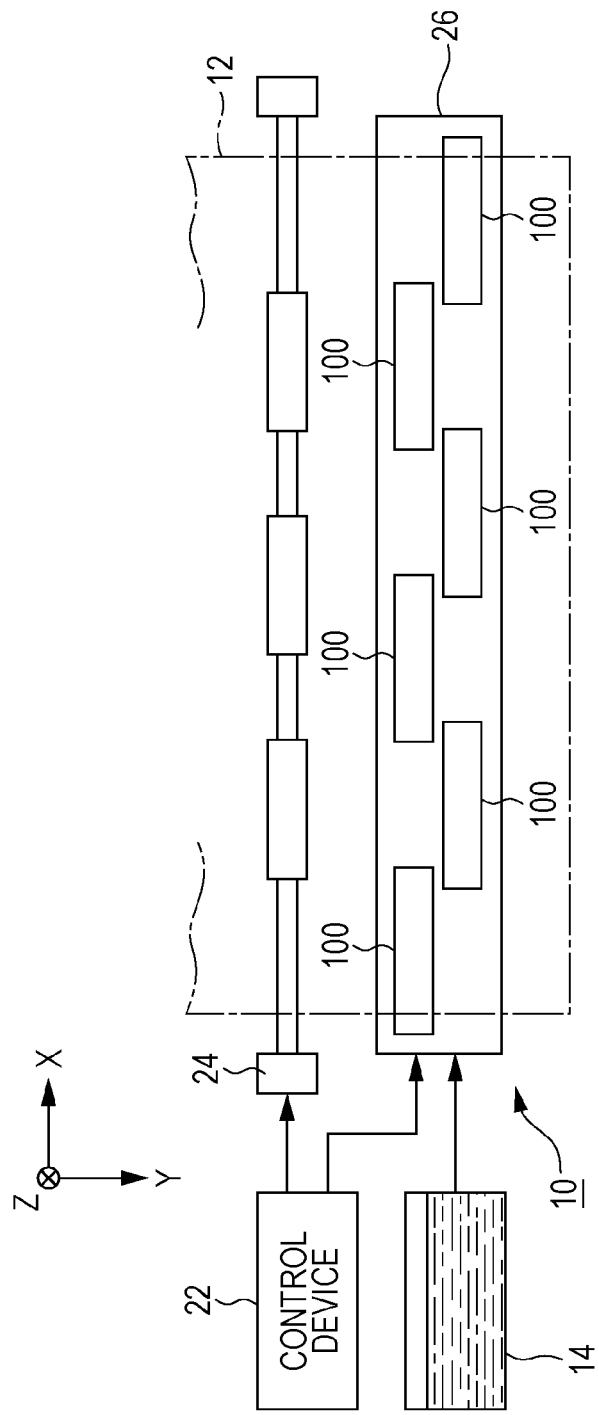
FIG. 1 is a configuration diagram of a printing apparatus according to a first embodiment.

FIG. 1 is a configuration diagram which illustrates a part of an ink jet printing apparatus 10 according to a first embodiment of the invention. The printing apparatus 10 according to the first embodiment is a liquid ejecting apparatus 10 which ejects ink as an example of liquid onto a medium (ejecting target) 12 such as a printing sheet, and includes a control device 22, a transport mechanism 24, and a liquid ejecting module 26. A liquid container (cartridge) 14 which stores ink is mounted on the printing apparatus 10.

The control device 22 integrally controls each element of the printing apparatus 10. The transport mechanism 24 transmits a medium 12 in a Y direction under a control of the control device 22. The liquid ejecting module 26 includes a plurality of liquid ejecting heads 100. The liquid ejecting module 26 according to the first embodiment is a line head in which the plurality of liquid ejecting heads 100 are arranged (so-called arrangement in zigzag, or staggered arrangement) along an X direction which is orthogonal to the Y direction. Each liquid ejecting head 100 ejects ink which is supplied from the liquid container 14 onto the medium 12 under a control of the control device 22. A desired image is formed on the surface of the medium 12 when each liquid ejecting head 100 ejects ink onto the medium 12 along with transporting of the medium 12 using the transport mechanism 24. Hereinafter, a direction which is perpendicular to an X-Y plane parallel to the medium 12 is denoted by a Z direction. An ejecting direction of ink (vertically downward direction) using each of the liquid ejecting heads 100 corresponds to the Z direction.

Figure 2:
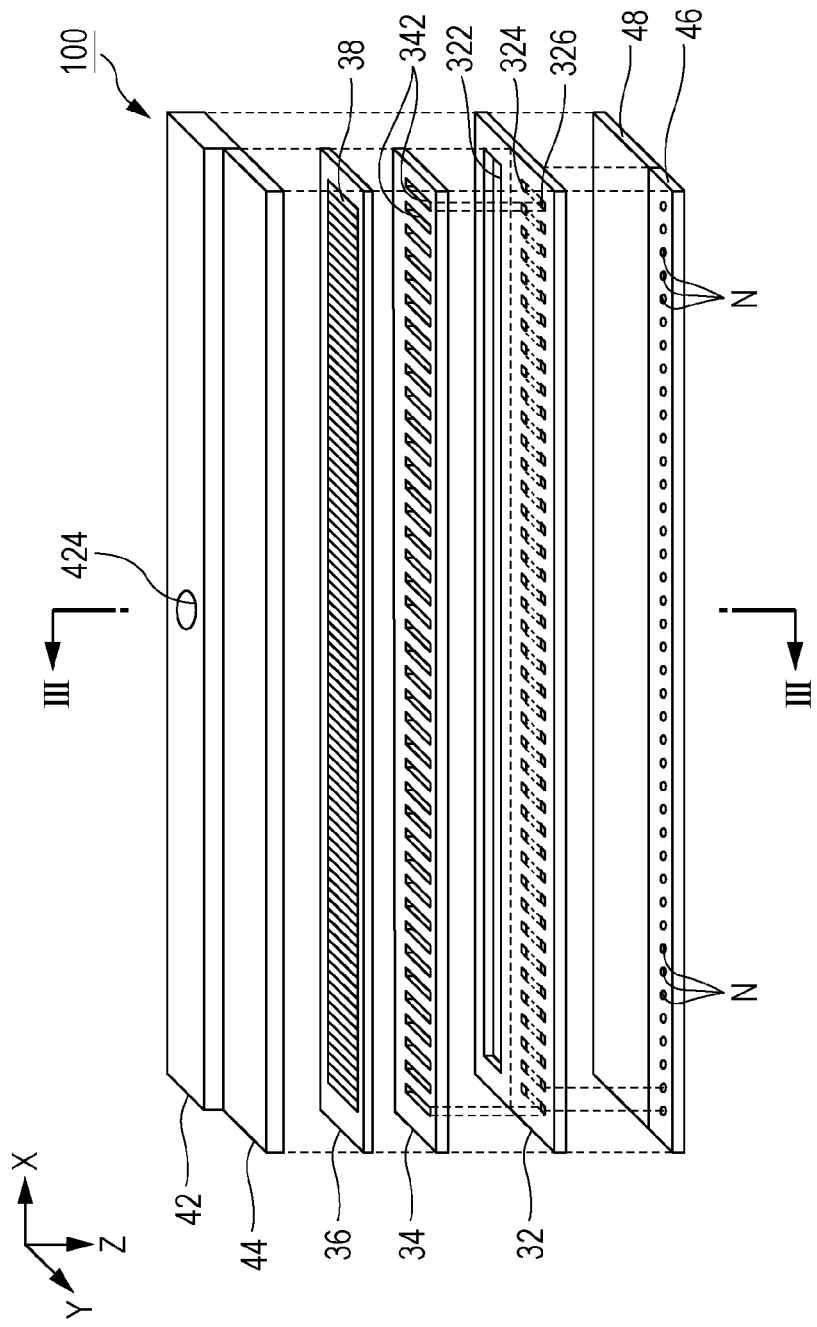
FIG. 2 is an exploded perspective view of a liquid ejecting head.
Figure 3:
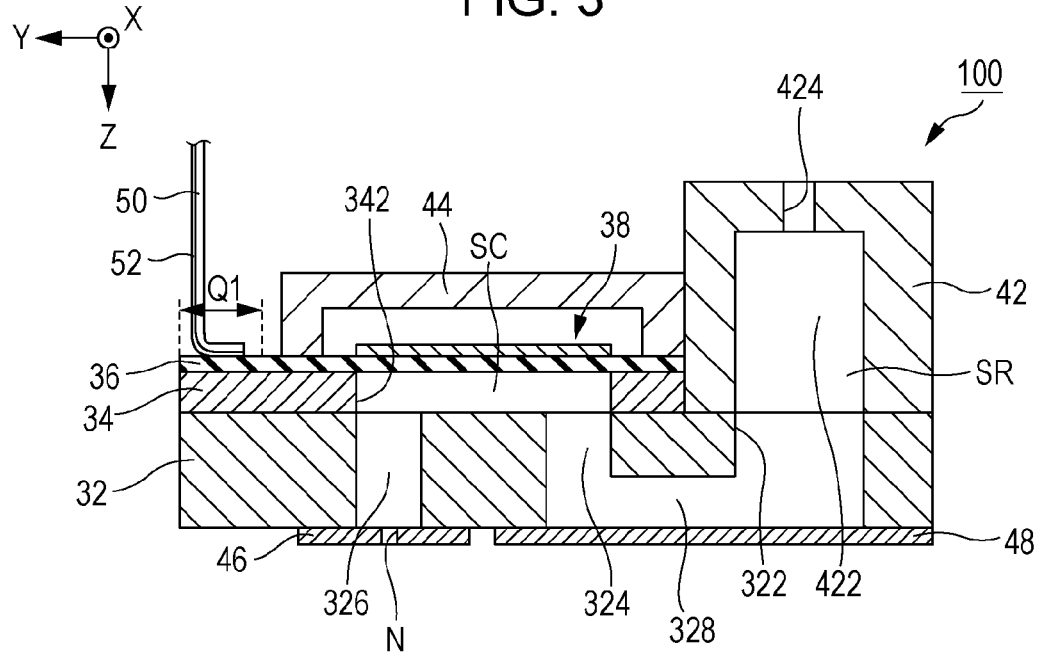
FIG. 3 is a sectional view of the liquid ejecting head (sectional view taken along line III-III in FIG. 2)

FIG. 2 is an exploded perspective view of one arbitrary liquid ejecting head 100, and FIG. 3 is a sectional view which is taken along line III-III (section parallel to Y-Z plane) in FIG. 2. As illustrated in FIGS. 2 and 3, the liquid ejecting head 100 according to the first embodiment is a structure body in which a pressure chamber substrate 34, a vibrating plate 36, a plurality of piezoelectric elements 38, a housing 42, and a sealing body 44 are provided on a plane on the negative side of a flow path substrate 32 in the Z direction, and a nozzle plate 46, and a compliance unit 48 are provided on a plane on the positive side of the flow path substrate 32 in the Z direction. Each element of the liquid ejecting head 100 is schematically an approximately flat-plate shaped member which is long in the X direction, and are bonded to each other using an adhesive, for example.

The nozzle plate 46 is a flat-plate member in which a plurality of nozzles (ejecting holes) which are arranged along the X direction are formed, and is fixed using an adhesive, for example, on the surface on the positive side of the flow path substrate 32 in the Z direction. Each nozzle N is a through hole through which ink passes.

The flow path substrate 32 is a flat-plate member for forming a flow path of ink. As illustrated in FIGS. 2 and 3, an opening portion 322, a supply flow path 324, and a communication flow path 326 are formed in the flow path substrate 32 according to the first embodiment. As illustrated in FIG. 2, the opening portion 322 is a through hole which is formed in a long shape along the X direction in a planar view (that is, when viewed in Z direction) so as to be continuous over the plurality of nozzles N. Meanwhile, the supply flow path 324 and the communication flow path 326 are through holes which are individually formed in each nozzle N. As illustrated in FIG. 3, a branching flow path (manifold) 328 in a groove shape which extends along the Y direction so as to communicate with the supply flow path 324 and the opening portion 322 is formed in each supply flow path 324 on the surface on the positive side (side opposite to pressure chamber substrate 34) of the flow path substrate 32 in the Z direction.

The housing 42 is a structure body which is formed of a resin material, and is integrally molded using injection molding, and is fixed onto the surface on the negative side of the flow path substrate 32 in the Z direction. As illustrated in FIG. 3, the accommodation unit 422 and an introducing hole 424 are formed in the housing 42 according to the first embodiment. The accommodation unit 422 is an external concave portion which corresponds to the opening portion 322 of the flow path substrate 32, and the introducing hole 424 is a through hole which communicates with the accommodation unit 422. As is understood from FIG. 3, a space which causes the opening portion 322 of the flow path substrate 32 and the accommodation unit 422 of the housing 42 to communicate with each other functions as a liquid storage chamber (reservoir) SR. Ink which is supplied from the liquid container 14, and passes through the introducing hole 424 is stored in a liquid storage chamber SR. The compliance unit 48 in FIGS. 2 and 3 is an element for absorbing a pressure change in the liquid storage chamber SR, and includes a flexible sheet member which can be elastically deformed, for example. Specifically, the compliance unit 48 is provided on the surface on the negative side of the flow path substrate 32 so that a base of the liquid storage chamber SR is configured by closing the opening portion 322 of the flow path substrate 32, each branching flow path 328, and each supply flow path 324. Accordingly, a flow path of ink which is branched to the branching flow path 328 of each nozzle N from the liquid storage chamber SR, and reaches the supply flow path 324 is formed.

As illustrated in FIGS. 2 and 3, the pressure chamber substrate 34 is a flat-plate member in which a plurality of opening portions 342 which will be the pressure chamber (cavity) SC are arranged along the X direction. Each opening portion 342 is a long through hole which goes along the Y direction in a planar view. An end portion of the opening portion 342 on the negative side in the Y direction overlaps with one supply flow path 324 of the flow path substrate 32 in a planar view, and an end portion of the opening portion 342 on the positive side in the Y direction overlaps with one communication flow path 326 of the flow path substrate 32. A material or a manufacturing method of the flow path substrate 32 or the pressure chamber substrate 34 is arbitrary; however, it is possible to form an expected flow path substrate 32, or the pressure chamber substrate 34 in simple and with high precision, by selectively eliminating a silicon (Si) single crystal substrate using a manufacturing technology of a semiconductor such as etching, for example.

As illustrated in FIGS. 2 and 3, the vibrating plate 36 is fixed onto the surface of the pressure chamber substrate 34 on a side opposite to the flow path substrate 32. The vibrating plate 36 is a flat-plate member which can elastically vibrate. For example, the vibrating plate 36 can be formed by stacking an elastic film which is formed of an elastic material such as silicon oxide ($S_iO_2$), and an insulating film which is formed of an insulating material such as zirconium oxide ($Z_rO_2$).

As is understood from FIG. 3, the vibrating plate 36 and the flow path substrate 32 face each other at an interval in the inside of each opening portion 342 of the pressure chamber substrate 34. A space which is located between the flow path substrate 32 and the vibrating plate 36 in the inside of each opening portion 342 functions as the pressure chamber SC which applies a pressure to ink in the space. The pressure chamber SC is individually formed in each nozzle N. As is understood from the above descriptions, the ink stored in the liquid storage chamber SR is supplied to each pressure chamber SC in parallel, and fills the pressure chamber by passing through the supply flow path 324 after being branched to the plurality of branching flow paths 328, and is ejected to the outside from the pressure chamber SC by passing through the communication flow path 326 and the nozzle N due to a pressure change according to a vibration of the vibrating plate 36. The pressure chamber substrate 34 functions as an element which supports the vibrating plate 36 so as to vibrate (support unit).

As illustrated in FIGS. 2 and 3, the plurality of piezoelectric elements 38 corresponding to nozzles N (pressure chamber SC) which are different from each other are formed on the surface of the vibrating plate 36 on a side opposite to the pressure chamber substrate 34. Each piezoelectric element 38 is a passive element which vibrates when a driving signal is supplied, and is arranged along the X direction so as to correspond to each pressure chamber SC. The sealing body 44 in FIGS. 2 and 3 is a structure body which protects each piezoelectric element 38, and reinforces a mechanical strength of the pressure chamber substrate 34 or the vibrating plate 36, and is fixed onto the surface of the vibrating plate 36 using an adhesive, for example. The plurality of piezoelectric elements 38 are accommodated inside a concave portion which is formed on a face which faces the vibrating plate 36 in the sealing body 44.

As illustrated in FIG. 3, a flexible wiring substrate 50 such as a flexible printed circuit (FPC), for example, is fixed to a region Q1 in an external region of the sealing body 44 (hereinafter, referred to as "connection region") of the vibrating plate 36. Plurality of external wiring 52 are formed in the wiring substrate 50. Each external wiring 52 is wiring for electrically connecting the liquid ejecting head 100 to an external device such as a control device 22 or a power circuit (not illustrated).

Figure 4:
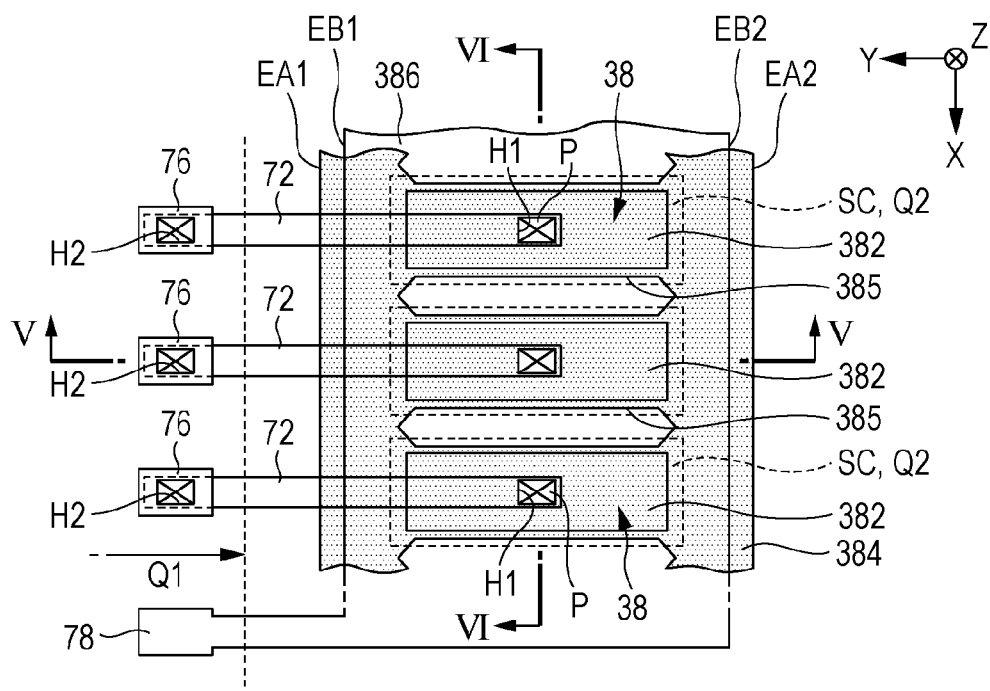
FIG. 4 is a plan view of a piezoelectric element.
Figure 5:
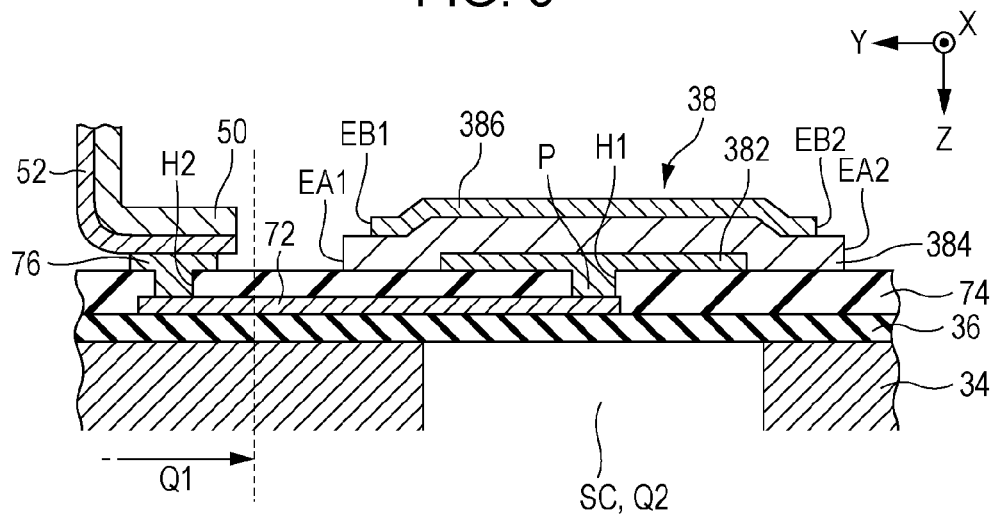
FIG. 5 is a sectional view which is taken along line V-V in FIG. 4.
Figure 6:
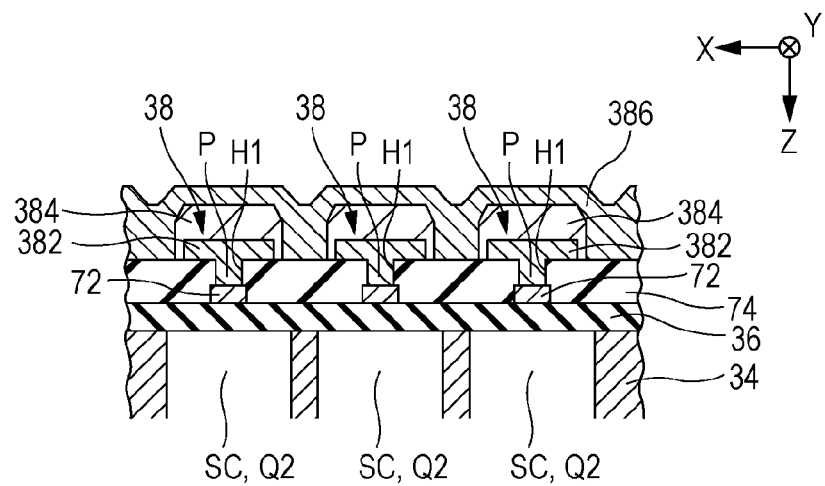
FIG. 6 is a sectional view which is taken along line VI-VI in FIG. 4.

A specific structure of each piezoelectric element 38 which will be described below in detail. FIG. 4 is a plan view of the piezoelectric element 38. FIG. 5 is a sectional view which is taken along line V-V in FIG. 4, and FIG. 6 is a sectional view which is taken along line in VI-VI in FIG. 4. In FIGS. 4 to 6, an illustration of the sealing body 44 is omitted for convenience.

As illustrated in FIGS. 4 to 6, a conductive layer 72 is formed in each pressure chamber SC on a plane of the vibrating plate 36. Each conductive layer 72 according to the first embodiment is a band-shaped wiring pattern which lineally extends along the Y direction. As illustrated in FIG. 4, a plurality of the conductive layers 72 corresponding to different pressure chambers SC are arranged in the X direction with intervals each other. Each conductive layer 72 extends in the Y direction so as to reach the connection region Q1 from the inside of the region Q2 which overlaps with the pressure chamber SC of the vibrating plate 36 (hereinafter, referred to as "vibrating region") in a planar view. The vibrating region Q2 corresponds to a region in the vibrating plate 36 which vibrates according to a displacement of the piezoelectric element 38. A material or a manufacturing method of the conductive layer 72 is arbitrary; however, it is possible to form the plurality of conductive layers 72 by forming a thin film of a conductive material with low resistance which includes platinum (Pt), or the like, for example, on the surface of the vibrating plate 36 using a well-known film-forming technology such as sputtering, and by selectively eliminating the thin film using a processing technology such as photolithography or etching.

As illustrated in FIGS. 5 and 6, an insulating layer 74 is formed on a face of the vibrating plate 36 on which the plurality of conductive layers 72 are formed. The insulating layer 74 is a thin insulating film which is continued over approximately the entire region of the vibrating plate 36. A material or a manufacturing method of the insulating layer 74 is arbitrary; however, it is possible to form the insulating layer 74 which is formed of zirconium oxide ($Z_rO_2$) by forming a thin film formed of a material containing zirconium, or the like, for example, using a well-known film-forming technology such as sputtering, and by heating (annealing) the thin film.

As illustrated in FIGS. 4 to 6, a first electrode layer 382 is formed in each pressure chamber SC on a plane of the insulating layer 74. The first electrode layer 382 is an electrode (individual electrode) which is individually formed in each piezoelectric element 38. As illustrated in FIG. 4, a plurality of first electrode layers 382 corresponding to pressure chambers SC which are different from each other are arranged at intervals each other in the X direction so as to correspond to arrangements of the plurality of pressure chambers SC. Each of the first electrode layers 382 according to the first embodiment is formed in the inside of the vibrating region Q2 in a planar view. That is, the periphery of the first electrode layer 382 is located on the inside of the pressure chamber SC in a planar view. A material or a manufacturing method of the first electrode layer 382 is arbitrary; however, it is possible to form the plurality of first electrode layers 382 by forming a thin film of a conductive material with low resistance which includes platinum (Pt), or the like, for example, on the surface of the insulating layer 74 using a well-known film-forming technology such as sputtering, and by selectively eliminating the thin film using a processing technology such as photolithography or etching. In addition, it is possible to secure adhesion of the first electrode layer 382 with respect to the insulating layer 74 by forming the first electrode layer 382 using a conductive material which contains platinum (Pt) and iridium (Ir).

A conductive hole (contact hole) H1 which penetrates the insulating layer 74 is formed in each pressure chamber SC at a location which is located in the vibrating region Q2 of the insulating layer 74 in a planar view. As illustrated in FIG. 4, the conductive hole H1 is formed in a region of the insulating layer 74 in which the conductive layer 72 and the first electrode layer 382 overlap each other in a planar view. Accordingly, the first electrode layer 382 which is formed on a plane of the insulating layer 74 comes into contact with the conductive layer 72 through the conductive hole H1 of the insulating layer 74. That is, a portion of the first electrode layer 382 which is located inside the conductive hole H1 functions as a point of contact P for electrically connecting the first electrode layer 382 and the conductive layer 72. When forming the conductive hole H1, a well-known technology (for example, processing technology such as photolithography or etching) can be arbitrarily adopted.

As illustrated in FIG. 4, the point of contact P (conductive hole H1) according to the first embodiment is located at approximately the center of the vibrating region Q2 in a planar view. Specifically, a position of the point of contact P is selected so that a relationship in which the point of contact P is located at the median point of two intersection points of a virtual straight line which passes through the point of contact P in the inside of the vibrating region Q2 and the periphery of the first electrode layer 382 is formed with respect to a straight line in the entire direction (360°) around the point of contact P. In other words, the point of contact P is located at the center of gravity of the vibrating region Q2 (planar shape of pressure chamber SC).

As illustrated in FIGS. 4 and 5, plurality of connection wiring 76 corresponding to each conductive layer 72 are formed in the connection region Q1 on the outside of each vibrating region Q2 in the vibrating plate 36. Each connection wiring 76 is an electrode (connection terminal) which is formed on a plane of the insulating layer 74 so as to overlap with an end portion on a side opposite to the point of contact P in the conductive layer 72 in a planar view. As illustrated in FIG. 5, each connection wiring 76 is electrically connected to the conductive layer 72 through a conductive hole H2 which penetrates the insulating layer 74, and is electrically connected to the external wiring 52 of the wiring substrate 50 which is fixed to the connection region Q1 of the vibrating plate 36. As is understood from the above descriptions, each first electrode layer 382 is electrically connected to the external wiring 52 of the wiring substrate 50 through the conductive hole H1 (point of contact P), the conductive layer 72, the conductive hole H2, and the connection wiring 76. That is, the conductive layer 72 according to the first embodiment functions as wiring which electrically connects the first electrode layer 382 to the external wiring 52. A driving signal which is supplied from an external device through the external wiring 52 is supplied to the first electrode layer 382 through the connection wiring 76 and the conductive layer 72.

A piezoelectric layer 384 is formed on a plane of the insulating layer 74 on which the plurality of first electrode layers 382 are formed. In FIG. 4, shading is performed with respect to the piezoelectric layer 384 for convenience. The piezoelectric layer 384 is formed of a piezoelectric material, and covers each first electrode layer 382. The piezoelectric layer 384 according to the first embodiment extends along the X direction so as to be continued over the plurality of pressure chambers SC in a planar view. Specifically, the piezoelectric layer 384 is formed in a band shape with a horizontal width which stretches between an end portion EA1 which is located on the positive side in the Y direction when viewed from each vibrating region Q2 and an end portion EA2 which is located on the negative side in the Y direction when viewed from each vibrating region Q2. That is, each vibrating region Q2 (pressure chamber SC) is included in a region in which the piezoelectric layer 384 is formed in a planar view. As illustrated in FIG. 4, a notch (slit) 385 which extends along the Y direction is formed at positions at intervals between each of the first electrode layers 382 which are adjacent to each other in a planar view, in the piezoelectric layer 384. A material or a manufacturing method of the piezoelectric layer 384 is arbitrary; however, for example, it is possible to form the piezoelectric layer 384 by forming a film of a piezoelectric material such as lead zirconate titanate using a well-known film-forming technology such as sputtering.

A second electrode layer 386 is formed on a plane of the piezoelectric layer 384. That is, the second electrode layer 386 is stacked on a side opposite to the vibrating plate 36 with respect to each first electrode layer 382, and the piezoelectric layer 384 is interposed between the first electrode layer 382 and the second electrode layer 386. The second electrode layer 386 according to the first embodiment is an electrode which is formed of a conductive material with low resistance, similarly to the first electrode layer 382. As illustrated in FIGS. 5 and 6, a region in which the first electrode layer 382 and the second electrode layer 386 overlaps with each other by interposing the piezoelectric layer 384 therebetween in a planar view corresponds to the piezoelectric element 38. That is, a piezoelectric element 38 which is configured by stacking the first electrode layer 382 (lower electrode), the piezoelectric layer 384, and the second electrode layer 386 (higher electrode) is formed on the surface of the vibrating plate 36 in each pressure chamber SC.

The second electrode layer 386 according to the first embodiment extends along the X direction so as to be continued over the plurality of pressure chambers SC in a planar view. That is, the second electrode layer 386 is an electrode which is common (common electrode) over the plurality of piezoelectric element 38. Specifically, the second electrode layer 386 is formed in a band shape with a horizontal width from an end portion EB1 which is located on the positive side in the Y direction when viewed from each vibrating region Q2 to an end portion EB2 which is located on the negative side in the Y direction when viewed from each vibrating region Q2 in a planar view. That is, each vibrating region Q2 (pressure chamber SC) is included in a region in which the second electrode layer 386 is formed in a planar view. The end portion EB1 on the positive side in the Y direction in the second electrode layer 386 is located on the negative side in the Y direction when viewed from the an end portion EA1 of the piezoelectric layer 384, and the end portion EB2 on the negative side in the Y direction in the second electrode layer 386 is located on the positive side in the Y direction when viewed from the an end portion EA2 of the piezoelectric layer 384. That is, the piezoelectric layer 384 is formed so as to be wider than the second electrode layer 386, and the second electrode layer 386 is included in a region in which the piezoelectric layer 384 is formed in a planar view.

As illustrated in FIG. 4, the connection wiring 78 is formed along with the above described connection wiring 76 in the connection region Q1. The connection wiring 78 is an electrode layer (connection terminal) which is electrically connected to the second electrode layer 386, and is connected to the external wiring 52 of the wiring substrate 50, similarly to each connection wiring 76. A predetermined reference voltage is applied from the external wiring 52 to the second electrode layer 386 through the connection wiring 78.

The piezoelectric layer 384 of each piezoelectric element 38 displaces according to a driving signal which is supplied to the first electrode layer 382 through the external wiring 52 of the wiring substrate 50, the connection wiring 76, and the conductive layer 72 from the external device. In other words, an electrode (lower electrode) which applies a voltage to the piezoelectric element 38 between the electrode and the second electrode layer 386 is configured of the first electrode layer 382 and the conductive layer 72. When a pressure in the pressure chamber SC is changed due to a vibration of the vibrating plate 36 which is linked with the displacement of the piezoelectric layer 384, ink which fills the pressure chamber SC passes through the communication flow path 326, and is ejected to the outside from the nozzle N. Since the notch 385 is formed between each of the piezoelectric elements 38 which are adjacent to each other in the X direction, propagation of vibration between the piezoelectric elements 38 is suppressed.

As described above, according to the first embodiment, since the first electrode layer 382 is an individual electrode for each piezoelectric element 38, and the second electrode layer 386 is a common electrode for the plurality of piezoelectric elements 38, a portion which is displaced due to a supply of a driving signal in the piezoelectric layer 384 (hereinafter, referred to as "active unit") is defined according to a planar shape of the first electrode layer 382. Specifically, a portion of the piezoelectric layer 384 which overlaps with each first electrode layer 382 in a planar view functions as the active unit. As is understood in FIG. 4, the active unit according to the first embodiment is located inside the vibrating region Q2. On the other hand, since the insulating layer 74 is interposed between the conductive layer 72 and the second electrode layer 386, an electric field which is enough to displace the piezoelectric layer 384 is not generated at a portion of the piezoelectric layer 384 in which the conductive layer 72 and the second electrode layer 386 face each other. That is, the portion of the piezoelectric layer 384 between the conductive layer 72 and the second electrode layer 386 does not function as the active unit.

Figure 7:
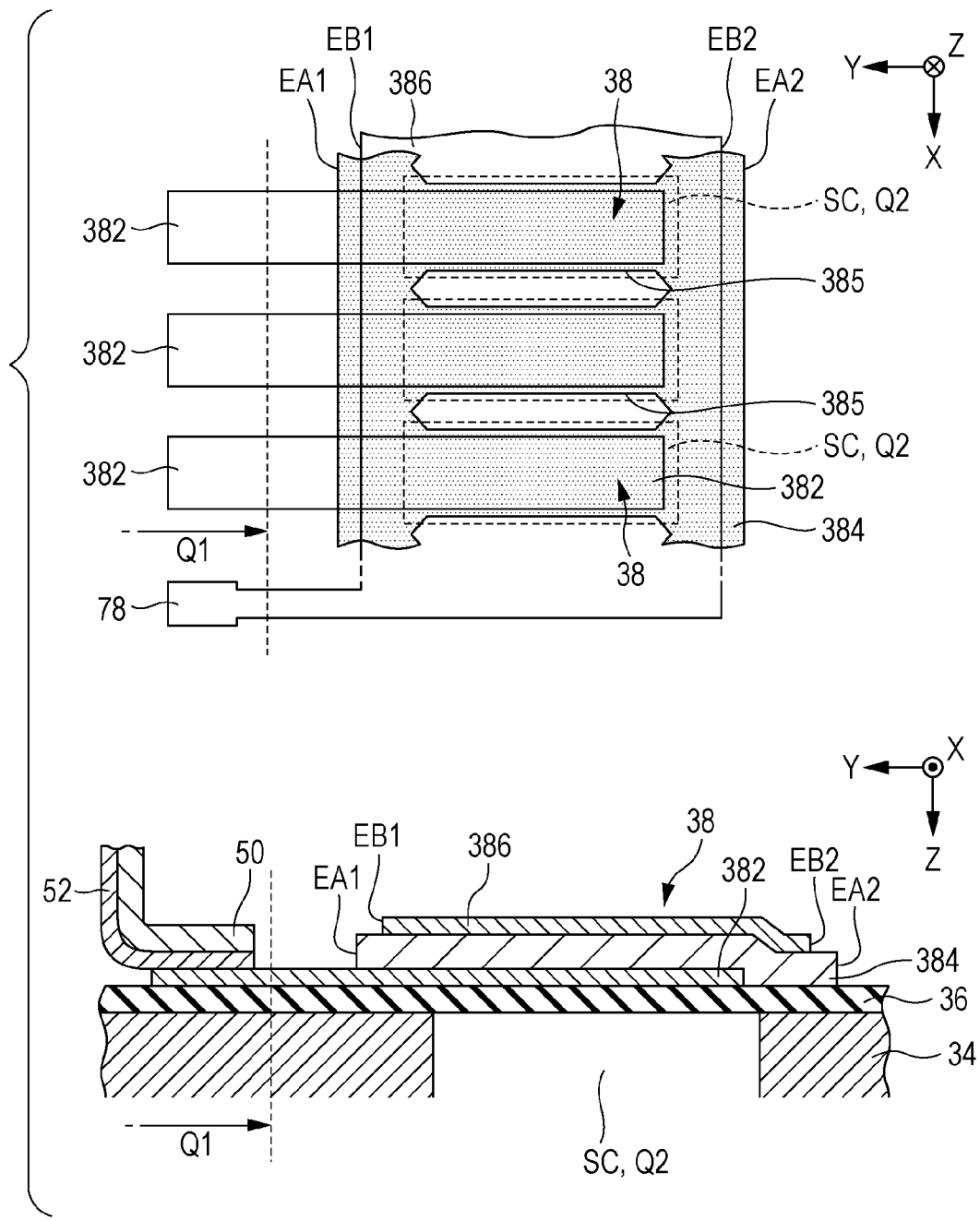
FIG. 7 is a plan view and a sectional view of a piezoelectric element in a comparison example.

FIG. 7 illustrates a configuration in which the external wiring 52 of the wiring substrate 50 is connected to the first electrode layer 382 by causing the first electrode layer 382 which is formed on the surface of the vibrating plate 36 to be extended to the connection region Q1 as a comparison example of the first embodiment (hereinafter, referred to as "comparison example 1"). In the comparison example 1, the first electrode layer 382 extends along the Y direction so as to intersect the end portion EB1 of the second electrode layer 386 in a planar view. As is understood from the sectional view in FIG. 7, since the first electrode layer 382 and the second electrode layer 386 face by interposing only the piezoelectric layer 384 also in the vicinity of the end portion EB1 of the second electrode layer 386, there is a possibility that the piezoelectric layer 384 may be displaced due to an operation of the electric field which is generated between the first electrode layer 382 and the second electrode layer 386, and the second electrode layer 386 may be separated from the end portion EB1, particularly, on a plane of the piezoelectric layer 384 due to the displacement. In contrast to the above described comparison example 1, as described above with reference to FIGS. 4 to 6 in the first embodiment, the conductive layer 72 which is connected to the first electrode layer 382 intersects the end portion EB1 of the second electrode layer 386 by extending along the Y direction in a planar view, and the first electrode layer 382 does not intersect the end portion EB1 of the second electrode layer 386. Since the insulating layer 74 is interposed between the conductive layer 72 and the second electrode layer 386, an electric field which is enough to displace the piezoelectric layer 384 is not generated in a region of the piezoelectric layer 384 which overlaps with the end portion EB1 of the second electrode layer 386. Accordingly, also in the first embodiment, it is possible to suppress a separation of the second electrode layer 386 (particularly, separation from end portion EB1) due to the displacement of the piezoelectric layer 384.

As a configuration for preventing the separation of the second electrode layer 386, for example, a configuration of confining the second electrode layer 386 by overlapping a protective layer with the end portion EB1 of the second electrode layer 386 like the technology in JP-A-2013-111807 (hereinafter, referred to as "comparison example 2"), or a configuration of confining the second electrode layer 386 by overlapping the sealing body 44 with the end portion EB1 of the second electrode layer 386 (hereinafter, referred to as "comparison example 3") can be assumed. However, in the comparison example 2, it is necessary to secure a region for forming the protective layer, and in the comparison example 3, it is necessary to secure a region for overlapping the sealing body 44 with the second electrode layer 386. According to the first embodiment, since the separation of the second electrode layer 386 is suppressed by forming the conductive layer 72, it is not necessary to prevent the separation of the second electrode layer 386 using the protective layer or the sealing body 44. Accordingly, there also in an advantage that it is possible to miniaturize the liquid ejecting head 100 compared to the comparison example 2 or the comparison example 3 in which it is necessary to secure a region for forming the protective layer or the sealing body 44. As described above, the configuration of preventing the separation of the second electrode layer 386 using the protective layer or the sealing body 44 is not necessary in the first embodiment in principle; however, it is also possible to adopt the configuration of preventing the separation of the second electrode layer 386 using the protective layer or the sealing body 44, in addition to the configuration in the first embodiment of preventing the separation of the second electrode layer 386 by forming the conductive layer 72.

According to the first embodiment, the point of contact P between the conductive layer 72 and the first electrode layer 382 is located inside the vibrating region Q2 in a planar view. That is, it is not necessary to secure a region for forming the point of contact P (conductive hole H1 of insulating layer 74) on the outside of the vibrating region Q2. Accordingly, according to the first embodiment, there is an advantage that it is possible to miniaturize the liquid ejecting head 100 compared to the configuration of forming the point of contact P on the outside of the vibrating region Q2.

Second Embodiment

A second embodiment of the invention will be described. In each form which is exemplified below, elements with the same operation or function as that in the first embodiment will be given the same mark which is used in descriptions of the first embodiment, and detailed descriptions thereof will be appropriately omitted.

Figure 8:
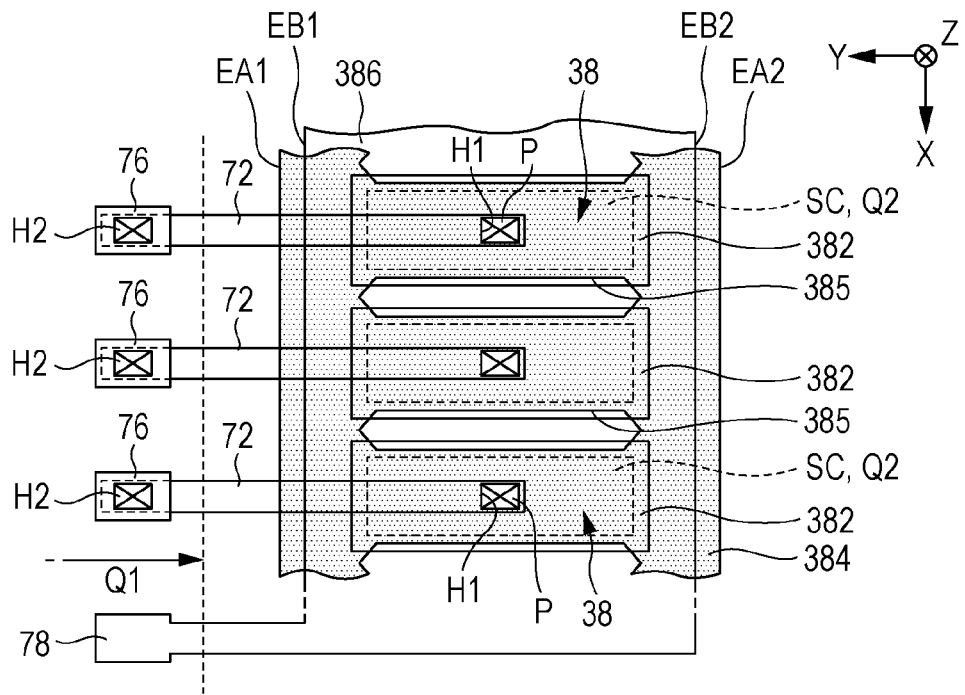
FIG. 8 is a plan view of a piezoelectric element of a printing apparatus according to a second embodiment.

FIG. 8 is a plan view of a piezoelectric element 38 according to the second embodiment. In the first embodiment, the configuration in which each first electrode layer 382 is located inside the vibrating region Q2 in a planar view is exemplified. In the second embodiment, as illustrated in FIG. 8, each first electrode layer 382 is formed so as to reach the outside of the vibrating region Q2 in a planar view. That is, the periphery of the first electrode layer 382 (periphery of piezoelectric layer 384) is located on the outside of an inner peripheral edge of the pressure chamber SC in a planar view.

Also in the second embodiment, it is possible to obtain the same effect as that in the first embodiment. In the second embodiment, since a boundary between an active unit which is displaced due to a supply of a driving signal and a non-active unit other than the active unit in the piezoelectric layer 384 is located on the outside of the vibrating region Q2, a displacement of the active unit (portion in vicinity of periphery) is suppressed due to a region on the outside of the vibrating region Q2 in the vibrating plate 36 in which vibration does not occur. On the other hand, according to the first embodiment, since a boundary between the active unit and the non-active unit of the piezoelectric layer 384 is located inside the vibrating region Q2 which can vibrate in the vibrating plate 36, a restriction with respect to the active unit of the piezoelectric layer 384 is relieved compared to the second embodiment. Accordingly, according to the first embodiment, there is an advantage that it is possible to suppress a concentration of stress in the first electrode layer 382 and the second electrode layer 386, or the piezoelectric layer 384 compared to the second embodiment.

According to the second embodiment, an area of the active unit of the piezoelectric layer 384 (first electrode layer 382) exceeds an area of the vibrating region Q2; however, in contrast to this, according to the first embodiment, then area of the active unit is lower than that the area of the vibrating region Q2. Specifically, according to the first embodiment, a dimension of the active unit in the Y direction is lower than a dimension of the vibrating region Q2 in the Y direction, and a dimension of the active unit in the X direction is lower than a dimension of the vibrating region Q2 in the X direction. Therefore, according to the first embodiment, there is an advantage that an electrostatic capacity of each piezoelectric element 38 is reduced compared to the second embodiment, and as a result, power which is consumed when driving each piezoelectric element 38 is reduced.

Third Embodiment

Figure 9:
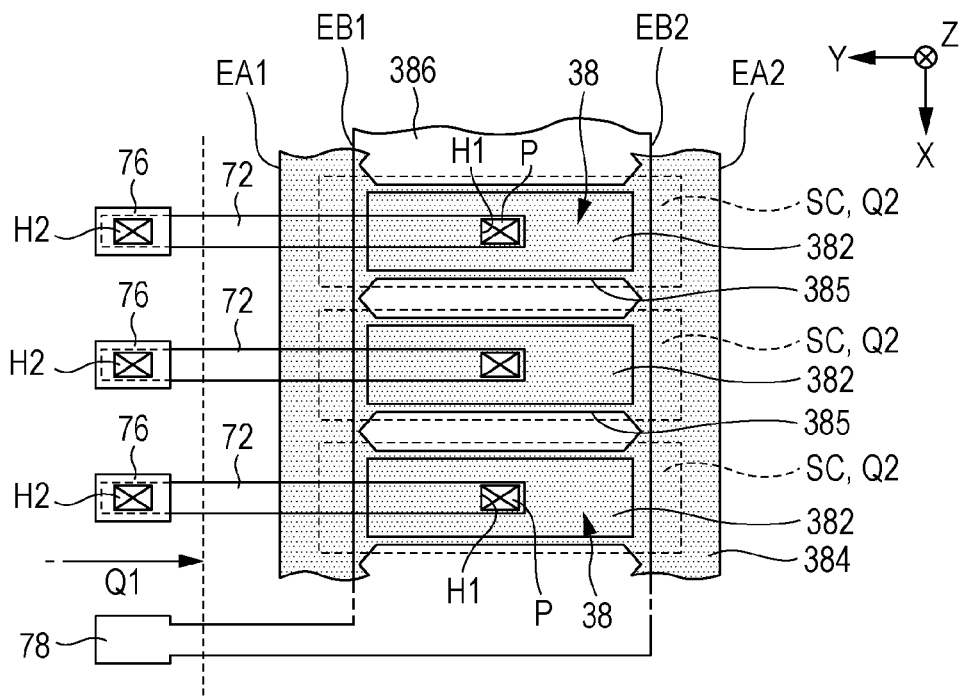
FIG. 9 is a plan view of a piezoelectric element of a printing apparatus according to a third embodiment.

FIG. 9 is a plan view which illustrates a piezoelectric element 38 according to a third embodiment. In the first embodiment, the second electrode layer 386 which extends from the end portion EB1 which is located on the positive side in the Y direction when viewed from each vibrating region Q2 to the end portion EB2 which is located on the negative side in the Y direction when viewed from each vibrating region Q2 in a planar view is exemplified. According to the third embodiment, as illustrated in FIG. 9, end portions EB1 and EB2 of the second electrode layer 386 are located between both ends of each vibrating region Q2 in the Y direction. That is, the end portion EB1 of the second electrode layer 386 is located on the negative side in the Y direction when viewed from the end portion of each vibrating region Q2 on the positive side in the Y direction, and the end portion EB2 of the second electrode layer 386 is located on the positive side in the Y direction when viewed from the end portion of each vibrating region Q2 on the negative side in the Y direction. A configuration in which an active unit which is defined in each first electrode layer 382 is located inside the vibrating region Q2 is the same as that in the first embodiment.

It is possible to obtain the same effect as that in the first embodiment also in the third embodiment. According to the third embodiment, the end portions EB1 and EB2 of the second electrode layer 386 overlap with the vibrating region Q2 in a planar view. That is, the end portion EB1 and EB2 vibrate along with the vibrating plate 36. Accordingly, from a viewpoint of preventing a separation of the second electrode layer 386 (separation from end portion EB1 or EB2), the configuration of the first embodiment or the second embodiment in which the end portions EB1 and EB2 do not overlap with the vibrating region Q2 is preferable compared to the third embodiment. Since the second electrode layer 386 is formed in a wide range in the Y direction in the first embodiment or the second embodiment compared to the third embodiment, there also is an advantage that it is possible to easily adopt a configuration of preventing the separation of the second electrode layer 386, by providing the protective layer (comparison example 2) or the sealing body 44 (comparison example 3) so that the second electrode layer does not overlap with the end portion EB1 or EB2. It is also possible to apply the configuration of the second embodiment in which the vibrating region Q2 is located inside the first electrode layer 382 in a planar view to the third embodiment.

MODIFICATION EXAMPLE

Each embodiment which is exemplified above can be variously modified. Specific modification modes will be exemplified below. Two or more modes which are arbitrarily selected from modes which are exemplified below can be appropriately combined as far as the modes do not conflict with each other.

(1) In the above described each embodiment, the first electrode layer 382 is set to the individual electrode, and the second electrode layer 386 is set to the common electrode; however, it is also possible to set both the first electrode layer 382 and the second electrode layer 386 to the individual electrode for each the piezoelectric element 38. In addition, it is possible to adopt a configuration in which the first electrode layer 382 is set to a common electrode for the plurality of piezoelectric elements 38, and the second electrode layer 386 is set to an individual electrode for each piezoelectric element 38. In the configuration in which the first electrode layer 382 is set to the common electrode, and the second electrode layer 386 is set to the individual electrode, driving signals are supplied to each second electrode layer 386 in parallel from the external device, and the active unit of the piezoelectric layer 384 is defined in each piezoelectric element 38 according to a planar shape of the second electrode layer 386.

In the above described configuration in which first electrode layer 382 is set to the common electrode, and the second electrode layer 386 is set to the individual electrode, since the active unit of the piezoelectric layer 384 is defined by the second electrode layer 386 which is far from the neutral face (face on which stress becomes zero at boundary between compressive stress and tensile stress in plate thickness direction of vibrating plate 36) of vibration of the vibrating plate 36, a stress concentrates on the second electrode layer 386, and it can cause damage, or the like. On the other hand, in the above described each configuration in which the first electrode layer 382 is set to the individual electrode, and the second electrode layer 386 is set to the common electrode, since the active unit of the piezoelectric layer 384 is defined by the first electrode layer 382 which is close to the neutral face of vibration of the vibrating plate 36, there is an advantage that a stress concentration in the second electrode layer 386 is suppressed (in addition, damage of second electrode layer 386 due to stress concentration is prevented).

(2) The form of the piezoelectric layer 384 is not limited to the above described exemplification. For example, a configuration in which the notch 385 which is exemplified in each of the above described embodiment is omitted (configuration in which piezoelectric layer 384 is continued in band shape over plurality of piezoelectric elements 38) can also be adopted. However, in the configuration in which the notch 385 of the piezoelectric layer 384 is omitted, the displacement of each piezoelectric element 38 is reduced by another piezoelectric element 38 at the periphery. Accordingly, in a viewpoint of sufficiently securing a displacement of each piezoelectric element 38, it is preferable to adopt a configuration in which the notch 385 is formed in the piezoelectric layer 384, similarly to the above described each embodiment. It is also possible to individually form the piezoelectric layer 384 in each piezoelectric element 38 by separating the piezoelectric element from each other.

Figure 10:
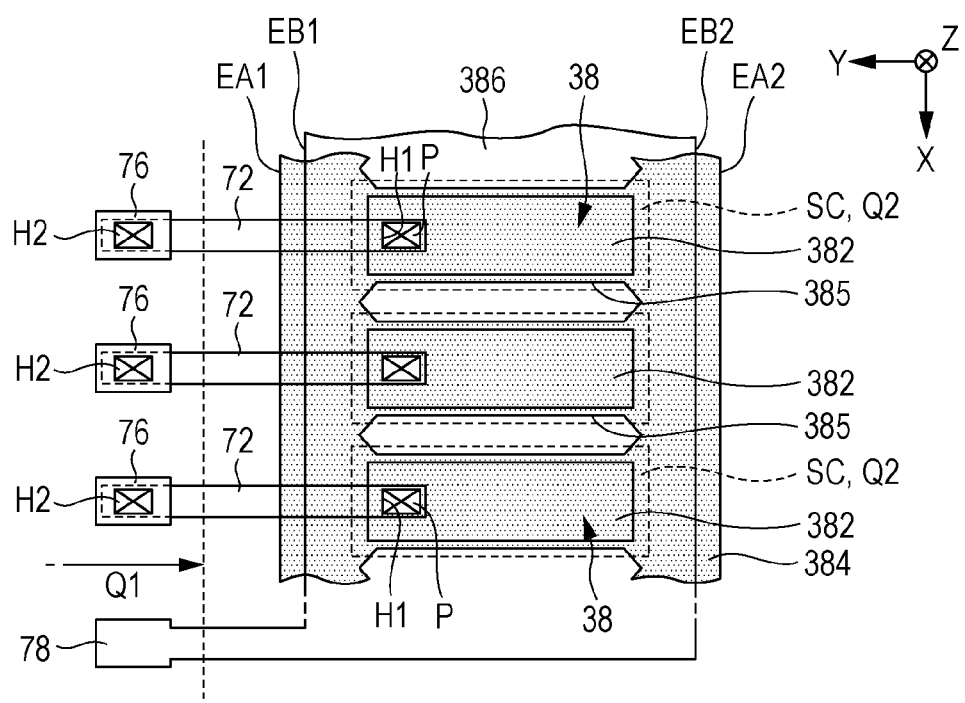
FIG. 10 is a plan view of a piezoelectric element of a printing apparatus according to a modification example.

(3) The position of the point of contact P between the conductive layer 72 and the first electrode layer 382 is not limited to the exemplification (approximately center of vibrating region Q2) in each embodiment. For example, as illustrated in FIG. 10, a configuration in which the point of contact P (conductive hole H1) is located at an end portion side of the vibrating region Q2 in the Y direction. In FIG. 10, a configuration in which the point of contact P is formed in the vicinity of an end portion on the connection wiring 76 side (extraction side of conductive layer 72) in the vibrating region Q2 is exemplified. As illustrated in FIG. 10, in the configuration in which the point of contact P is located in the vicinity of the end portion of the vibrating region Q2, since vibration (displacement amount) of the vibrating plate 36 becomes asymmetric in the vibrating region Q2, there is a possibility that an operation of effectively changing a pressure in the inside of the pressure chamber SC using vibration of the vibrating plate 36 may be hindered. On the other hand, in the above described each embodiment, since the point of contact P between the conductive layer 72 and the first electrode layer 382 is located at approximately the center of the vibrating region Q2, deviation of vibration of the vibrating plate 36 in the vibrating region Q2 is suppressed. Accordingly, according to the configuration in which the point of contact P is located at approximately the center of the vibrating region Q2, it is possible to appropriately vibrate the vibrating plate 36 so that a pressure in the pressure chamber SC is efficiently changed.

(4) The number of the point of contacts P in each piezoelectric element 38 is arbitrary. For example, it is also possible to electrically connect the conductive layer 72 and the first electrode layer 382 in the plurality of point of contacts P in the inside of the vibrating region Q2, by forming the plurality of conductive holes H1 in a region in which the conductive layer 72 and the first electrode layer 382 overlaps with each other in a planar view, in the insulating layer 74.

Figure 11A:
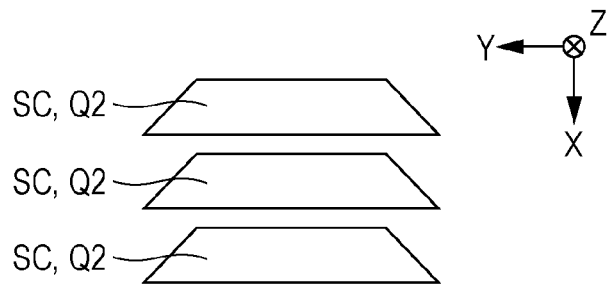
FIGS. 11A to 11C are explanatory diagrams of pressure chambers in planar shapes in a modification example.
Figure 11B:
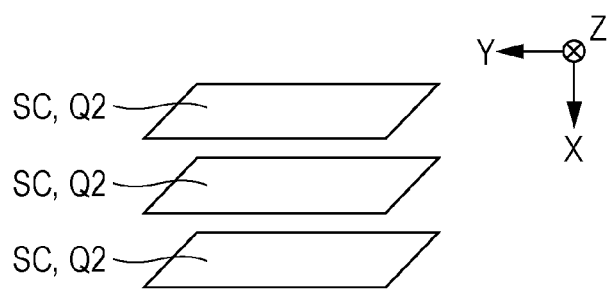
Figure 11C:
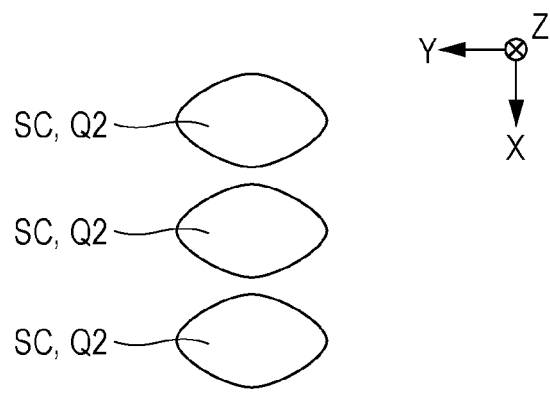

(5) The planar shape of the pressure chamber SC is not limited to the above described each exemplification (rectangular shape). For example, when a silicon (Si) single crystal substrate is used as the pressure chamber substrate 34, actual planar shapes of the pressure chamber SC are the shapes which are illustrated in FIGS. 11A to 11C, and become a trapezoidal shape (in FIG. 11A) reflecting a crystal face, or a parallelogram shape (in FIG. 11B). In addition, as illustrated in FIG. 11C, it is also possible to adopt a configuration in which a planar shape of the pressure chamber SC is set to a closed figure which is surrounded with a curved line (for example, elliptical shape or oval shape), or a polygonal shape (for example, diamond shape) in which a corner portion is rounded.

(6) In the above described each embodiment, a piezoelectric element 38 in which a driving signal is converted into mechanical vibration using a piezoelectric effect is exemplified; however, it is also possible to adopt the configuration which is exemplified in each of the above described embodiments in the piezoelectric element in which a mechanical operation is converted into an electric signal due to a piezoelectric effect. For example, a piezoelectric element in which vibration applied to a vibrating plate from the outside is converted into an electric signal due to a piezoelectric effect can be used in a vibration detecting device (vibration sensor).

Figure 12A:
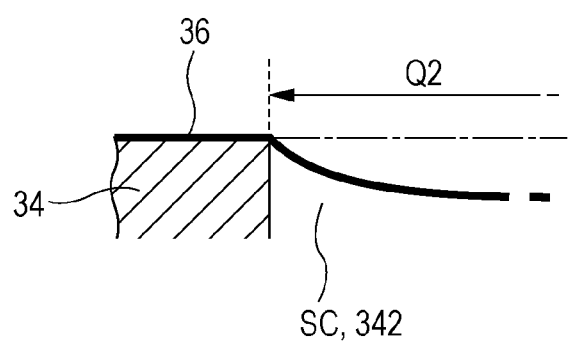
FIGS. 12A and 12B are explanatory diagrams of a vibrating region of a vibrating plate.
Figure 12B:
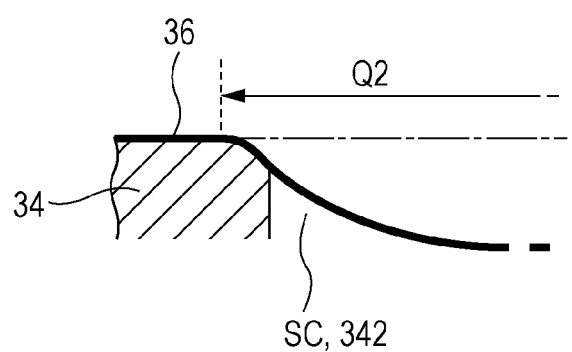

(7) In the above described each embodiment, as illustrated in FIG. 12A, a region of the vibrating plate 36 which overlaps with the pressure chamber SC in a planar view is denoted by a vibrating region Q2; however, in practice, as illustrated in FIG. 12B, there is a possibility that a region in the vicinity of the inner peripheral edge of the opening portion 342 in the pressure chamber substrate 34 may deform along with vibration of the vibrating plate 36. In a situation in FIG. 12B, a region which is wider than the pressure chamber SC in a planar view is defined as the vibrating region Q2. As is understood from the above descriptions, the vibrating region Q2 of the vibrating plate 36 is defined as a region of the vibrating plate 36 which vibrates along with the piezoelectric element 38, and does not necessarily coincide with the planar shape of the pressure chamber SC.

(8) In the above described each embodiment, a line head in which a plurality of liquid ejecting heads 100 are arranged in the X direction which is orthogonal to the Y direction in which a medium 12 is transported is exemplified; however, it is also possible to apply the invention to a serial head. For example, as illustrated in FIG. 13, each liquid ejecting head 100 ejects ink onto the medium 12 while a carriage 28 on which the plurality of liquid ejecting heads 100 according to each of the above described embodiments are mounted reciprocating in the X direction under a control of a control device 22.

(9) The printing apparatus 10 which is exemplified in the above described each embodiment can be adopted in various devices such as a fax machine, a copy machine, and the like, in addition to an apparatus which is exclusive to printing. Of course, a use of the liquid ejecting apparatus in the invention is not limited to printing. For example, a liquid ejecting apparatus which ejects a solution of a coloring material is used as a manufacturing device for forming a color filter of a liquid crystal display. In addition, a liquid ejecting apparatus which ejects a solution of a conductive material is used as a manufacturing device for forming wiring or an electrode of a wiring substrate.

What is claimed is:

1. A piezoelectric element comprising:
a first electrode layer which is staked on a vibrating plate;
a second electrode layer which is stacked on a side opposite to the vibrating plate with respect to the first electrode layer;
a piezoelectric layer which is interposed between the first electrode layer and the second electrode layer; and
a conductive layer which electrically connects the first electrode layer to external wiring,
wherein a point of contact where the conductive layer and the first electrode layer directly contact each other is in a vibrating region of the vibrating plate, the point of contact being disposed in a conductive hole in an insulating layer that is between the first electrode layer and the conductive layer.

2. The piezoelectric element according to claim 1,
wherein an active unit is not formed in the piezoelectric layer between the conductive layer and the second electrode layer.

3. The piezoelectric element according to claim 2,
wherein the conductive hole is formed in the vibrating region in the insulating layer.

4. The piezoelectric element according to claim 1,
wherein the first electrode layer is an individual electrode, and the second electrode layer is a common electrode.

5. The piezoelectric element according to claim 1,
wherein the point of contact is located at approximately a center of the vibrating region.

6. A liquid ejecting head comprising:
a pressure chamber substrate in which an opening portion which will be a pressure chamber filled with liquid is formed;
a vibrating plate which seals the opening portion by being stacked on the pressure chamber substrate; and
a piezoelectric element which vibrates the vibrating plate,
wherein the piezoelectric element includes
a first electrode layer which is stacked on the vibrating plate,
a second electrode layer which is stacked on a side opposite to the vibrating plate with respect to the first electrode layer,
a piezoelectric layer which is interposed between the first electrode layer and the second electrode layer, and
a conductive layer which electrically connects the first electrode layer to external wiring, and
wherein a point of contact where the conductive layer and the first electrode layer directly contact each other is in a vibrating region of the vibrating plate, the point of contact being disposed in a conductive hole in an insulating layer that is between the first electrode layer and the conductive layer.

7. A liquid ejecting apparatus comprising:
the liquid ejecting head according to claim 6.

* * * * *